(12) United States Patent
Dorgan et al.

(10) Patent No.: US 11,515,251 B2
(45) Date of Patent: Nov. 29, 2022

(54) FINFET TRANSISTORS AS ANTIFUSE ELEMENTS

(71) Applicant: Intel Corporation, Santa Clara, CA (US)

(72) Inventors: Vincent Dorgan, Hillsboro, OR (US); Jeffrey Hicks, Banks, OR (US); Inanc Meric, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 964 days.

(21) Appl. No.: 15/943,009

(22) Filed: Apr. 2, 2018

(65) Prior Publication Data

US 2019/0304906 A1    Oct. 3, 2019

(51) Int. Cl.

| | |
|---|---|
| *H01L 23/525* | (2006.01) |
| *H01L 29/78* | (2006.01) |
| *H01L 23/64* | (2006.01) |
| *H01L 29/417* | (2006.01) |
| *H01L 21/8234* | (2006.01) |
| *H01L 27/105* | (2006.01) |
| *G11C 11/40* | (2006.01) |

(Continued)

(52) U.S. Cl.
CPC .......... *H01L 23/5252* (2013.01); *G11C 11/40* (2013.01); *G11C 17/16* (2013.01); *H01L 21/823431* (2013.01); *H01L 23/647* (2013.01); *H01L 27/1052* (2013.01); *H01L 27/11206* (2013.01); *H01L 29/41791* (2013.01); *H01L 29/785* (2013.01)

(58) Field of Classification Search
CPC ............. H01L 23/5252; H01L 23/5254; H01L 27/11206; H01L 29/785; G11C 17/16
See application file for complete search history.

(56) References Cited

U.S. PATENT DOCUMENTS 6,858,478 B2 * 2/2005 Chau .................... H01L 29/4908
                                                                438/149
7,190,050 B2 * 3/2007 King ....................... H01L 21/84
                                                                257/401

(Continued)

FOREIGN PATENT DOCUMENTS

EP          3407383 B1 * 11/2020 ......... H01L 23/5252
WO   WO-2004059726 A1 *  7/2004 ........ H01L 27/11807

*Primary Examiner* — Victoria K. Hall
(74) *Attorney, Agent, or Firm* — Schwabe, Williamson & Wyatt, P.C.

(57) ABSTRACT

Embodiments herein may describe techniques for an integrated circuit including a FinFET transistor to be used as an antifuse element having a path through a fin area to couple a source electrode and a drain electrode after a programming operation is performed. A FinFET transistor may include a source electrode in contact with a source area, a drain electrode in contact with a drain area, a fin area including silicon and between the source area and the drain area, and a gate electrode above the fin area and above the substrate. After a programming operation is performed to apply a programming voltage between the source electrode and the drain electrode to generate a current between the source electrode, the fin area, and the drain electrode, a path may be formed through the fin area to couple the source electrode and the drain electrode. Other embodiments may be described and/or claimed.

20 Claims, 6 Drawing Sheets

(51) Int. Cl.
*H01L 27/112* (2006.01)
*G11C 17/16* (2006.01)

(56) References Cited

U.S. PATENT DOCUMENTS

| | | | | |
|---|---|---|---|---|
| 8,400,813 B2* | 3/2013 | Lee | ............................ | G11C 7/06 |
| | | | | 365/96 |
| 8,629,420 B1* | 1/2014 | Shrivastava | .... | H01L 21/823821 |
| | | | | 257/4 |
| 8,742,457 B2* | 6/2014 | Yang | ................ | H01L 27/11206 |
| | | | | 257/183 |
| 8,957,482 B2* | 2/2015 | Hsueh | ................... | H01L 27/112 |
| | | | | 257/379 |
| 9,293,221 B1* | 3/2016 | Liu | ........................ | G11C 17/18 |
| 9,589,970 B1* | 3/2017 | Tseng | ................ | H01L 29/0653 |
| 9,754,875 B1* | 9/2017 | Fogel | ................ | H01L 29/66545 |
| 10,056,329 B1* | 8/2018 | Adusumilli | ............ | H01L 21/308 |
| 11,189,564 B2* | 11/2021 | Chao | ........................ | G11C 17/16 |
| 11,264,317 B2* | 3/2022 | Dorgan | .................... | H01L 23/50 |
| 11,276,697 B2* | 3/2022 | Chao | .................... | H01L 27/0886 |
| 2007/0128782 A1* | 6/2007 | Liu | ........................ | H01L 29/785 |
| | | | | 438/187 |
| 2008/0296632 A1* | 12/2008 | Moroz | .................. | H01L 29/785 |
| | | | | 257/255 |
| 2010/0202184 A1* | 8/2010 | Lee | ........................ | G11C 17/16 |
| | | | | 365/96 |
| 2010/0244144 A1* | 9/2010 | Hsueh | ............... | H01L 27/11206 |
| | | | | 257/379 |
| 2015/0255469 A1* | 9/2015 | Choi | ................ | H01L 27/11206 |
| | | | | 257/529 |
| 2016/0141295 A1* | 5/2016 | Wu | .................... | H01L 27/11286 |
| | | | | 365/96 |
| 2018/0019340 A1* | 1/2018 | Adusumilli | ....... | H01L 27/11206 |
| 2018/0145083 A1* | 5/2018 | Tong | ................ | H01L 27/11206 |

* cited by examiner

PROGRAMMING

SENSE AND STANDBY OPERATION

PROGRAMMING

SENSE AND STANDBY OPERATION

FINFET TRANSISTORS AS ANTIFUSE ELEMENTS

FIELD

Embodiments of the present disclosure generally relate to the field of integrated circuits, and more particularly, to antifuse elements and memory arrays.

BACKGROUND

An integrated circuit (IC) may include many components, e.g., transistors, resistors, capacitors, diodes, formed on a semiconductor substrate. In addition, ICs may often include one or more types of memory arrays formed by multiple memory cells, such as a CMOS memory array including multiple memory cells, an antifuse memory array including multiple antifuse elements, or a fuse memory array including multiple fuse elements. In electronics and electrical engineering, a fuse element may be an electrical safety device that operates to provide overcurrent protection of an electrical circuit. Normally, a fuse element may include a copper wire, strip, or interconnect, which may melt or break down when too much current flows through it, thereby interrupting the current. A fuse element with a copper wire may melt at a high current, and may create a void space in the fuse element after the copper wire has been melted, which may post security risks. In addition, a fuse memory array including multiple fuse elements with copper wire may occupy a large area.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1B:
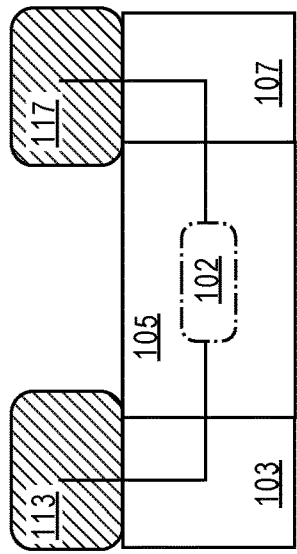
FIGS. 1(a)-1(c) schematically illustrate diagrams, in three-dimensional view or in cross sectional view, of a FinFET transistor to be used as an antifuse element having a path through a fin area to couple a source electrode and a drain electrode after a programming operation is performed, in accordance with some embodiments.

A fuse element may be an electrical safety device that operates to provide overcurrent protection of an electrical circuit. Conventionally, a fuse element may include a copper interconnect. A copper interconnect of a fuse element may melt at a high current, e.g., around 10 milliamps (mA) to 30 mA, when a high voltage, e.g., 5 voltage, is applied to the fuse element. After the copper interconnect of the fuse element has been melted, the fuse element may include a void space that was occupied by the copper interconnect before it has been melted. Such a void space may be detectable by top-down imaging techniques, hence making the fuse element vulnerable for security reasons. In addition, a fuse memory array including multiple fuse elements having copper interconnects may occupy a large area.

An antifuse element may be an electrical device that performs operations opposite to a fuse element. Whereas a fuse element starts with a low resistance and may permanently break an electrically conductive path (typically when the current through the path exceeds a specified limit), an antifuse element starts with a high resistance and may permanently create an electrically conductive path (typically when the voltage across the antifuse element exceeds a certain level). A memory array may be formed by including multiple antifuse elements, or multiple fuse elements.

Embodiments herein may present an antifuse element including a FinFET transistor having a path through a fin area to couple a source electrode and a drain electrode after a programming operation is performed. A first resistance may exist between the source electrode, the fin area, and the drain electrode. A second resistance may exist between the source electrode and the drain electrode, and the path through the fin area to couple the source electrode and the drain electrode. The first resistance may be about 102 to 104 times larger than the second resistance. The two different resistances may be used to represent a digital 0 and a digital 1 respectively. After a programming operation is performed on the FinFET transistor to form a path through a fin area to couple a source electrode and a drain electrode, no void space is created within the FinFET transistor. Therefore an antifuse element including the FinFET transistor may be safer compared to a fuse element including a copper interconnect.

Embodiments herein may present an integrated circuit (IC) including a source electrode in contact with a source area on a substrate, a drain electrode in contact with a drain area on the substrate, a fin area including silicon and between the source area and the drain area, and a gate electrode above the fin area and above the substrate. The source area, the fin area, the gate electrode, and the drain area form a FinFET transistor. A first resistance may exist between the source electrode, the fin area, and the drain electrode. After a programming operation is performed to apply a programming voltage between the source electrode and the drain electrode to generate a current between the source electrode, the fin area, and the drain electrode, a path may be formed through the fin area to couple the source electrode and the drain electrode. A second resistance may exist between the source electrode and the drain electrode, and the path through the fin area to couple the source electrode and the drain electrode.

Embodiments herein may present a method for forming an IC. The method may include: forming a source area on a substrate, a drain area on the substrate, and a fin area including silicon and between the source area and the drain area. The method may also include forming a source electrode in contact with the source area, forming a drain electrode in contact with the drain area, and forming a gate electrode above the fin area and above the substrate. The source area, the fin area, the gate electrode, and the drain area may form a FinFET transistor, and a first resistance may exist between the source electrode, the fin area, and the drain electrode. After a programming operation is performed to apply a programming voltage between the source electrode and the drain electrode to generate a current between the source electrode, the fin area, and the drain electrode, a path may be formed through the fin area to couple the source electrode and the drain electrode. A second resistance may exist between the source electrode and the drain electrode, and the path through the fin area to couple the source electrode and the drain electrode.

Embodiments herein may present a computing device including a circuit board and an antifuse memory array coupled to the circuit board. The antifuse memory array may include a plurality of antifuse cells. An antifuse cell of the plurality of antifuse cells may include an antifuse element and a selector. An antifuse element may include a source electrode in contact with a source area on a substrate, a drain electrode in contact with a drain area on the substrate, a fin area including silicon and between the source area and the drain area, and a gate electrode above the fin area and above the substrate. The source area, the fin area, the gate electrode, and the drain area may form a FinFET transistor. A first resistance may exist between the source electrode, the fin area, and the drain electrode. After a programming operation is performed to apply a programming voltage between the source electrode and the drain electrode to generate a current between the source electrode, the fin area, and the drain electrode, a path may be formed through the fin area to couple the source electrode and the drain electrode. A second resistance may exist between the source electrode and the drain electrode, and the path through the fin area to couple the source electrode and the drain electrode. The source electrode may be coupled to a bit line of the antifuse memory array, and the drain electrode may be coupled to a first contact of the selector. The selector may further include a second contact coupled to a word line of the antifuse memory array.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1C:
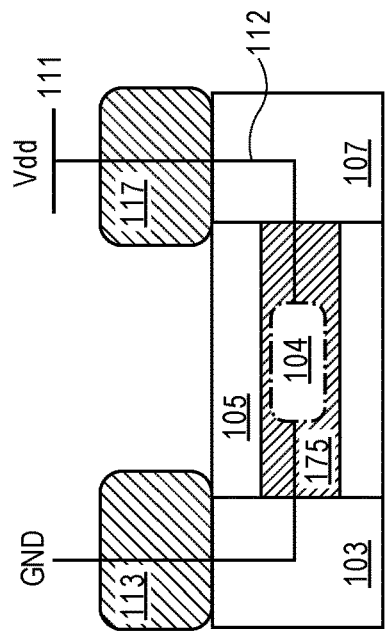
Figure 1A:
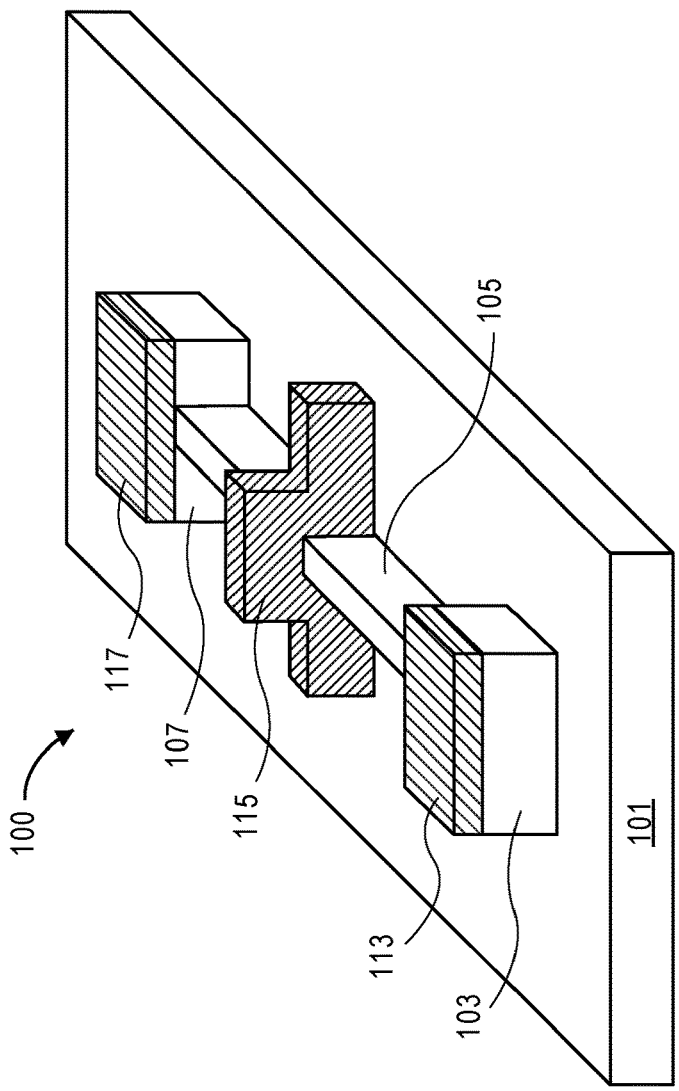

FIGS. 1(a)-1(c) schematically illustrate diagrams, in three-dimensional view or in cross sectional view, of a FinFET transistor 100 to be used as an antifuse element having a path 175 through a fin area 105 to couple a source electrode 113 and a drain electrode 117 after a programming operation is performed, in accordance with some embodiments. For clarity, features of the FinFET transistor 100, the fin area 105, the source electrode 113, the drain electrode 117, and the path 175 may be described below as examples for understanding an example FinFET transistor, a fin area, a source electrode, a drain electrode, and a path. It is to be understood that there may be more or fewer components within a FinFET transistor, a fin area, a source electrode, a drain electrode, and a path. Further, it is to be understood that one or more of the components within a FinFET transistor, a fin area, a source electrode, a drain electrode, and a path may include additional and/or varying features from the description below, and may include any device that one having ordinary skill in the art would consider and/or refer to as a FinFET transistor, a fin area, a source electrode, a drain electrode, and a path.

In embodiments, as shown in FIG. 1(a), the FinFET transistor 100 may be a PMOS FinFET or a NMOS FinFET. The FinFET transistor 100 may include a substrate 101, a source area 103 on a substrate, a drain area 107 on the substrate, and the fin area 105 including silicon and between the source area 103 and the drain area 107 on the substrate 101. The substrate 101 may be a bulk substrate or a silicon-on-insulator (SOI) substrate. A gate electrode 115 may be above the fin area 105 and above the substrate 101. The source electrode 113 may be in contact with the source area 103. The drain electrode 117 may be in contact with the drain area 107. The source electrode 113, the gate electrode 115, or the drain electrode 117 may include germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

In embodiments, as shown in FIG. 1(b), a first resistance 102 may exist between the source electrode 113, the fin area 105 and the drain electrode 117. The resistance 102 represented by a symbol may be a symbolic view to show a resistance, not a real physical component.

In embodiments, as shown in FIG. 1(c), after a programming voltage 111 may be applied between the source electrode 113 and the drain electrode 117 to generate a current 112 flowing between the source electrode 113 and the drain electrode 117, the path 175 may be formed through the fin area 105 to couple the source electrode 113 and the drain electrode 117. The programming operation may be performed when the FinFET transistor 100 is in an on-state having a voltage between the gate electrode 115 and the source electrode 113 larger than a threshold voltage, or when the FinFET transistor 100 is in an off-state having a voltage between the gate electrode 115 and the source electrode 113 less than the threshold voltage. The path 175 may be a permanent conductive path that exists after the programming voltage 111 is removed. The path 175 may include a material migrated from the source electrode 113 or the drain electrode 117, or amorphous silicon. A second resistance 104 may exist between the source electrode 113, the drain electrode 117, and the path 175 through the fin area 105. The first resistance 102 may be about 102 to 104 times larger than the second resistance 104.

In embodiments, the first resistance 102 and the second resistance 104 of the FinFET transistor 100 may represent a digital 0 and a digital 1, or a digital 1 and a digital 0, respectively. The FinFET transistor 100 may be programmed to be 0 or 1, without creating a void space within the FinFET transistor 100. Hence, the FinFET transistor 100 may be more secure than a fuse element including a copper interconnect, which may leave a void space once the copper interconnect is melted after a programming voltage is applied to the fuse element. The FinFET transistor 100 may be used to store security keys on-die, and its stored content may not be able to be discovered by imaging inspection of the void spaces contained in the FinFET transistor 100.

Figure 2A:
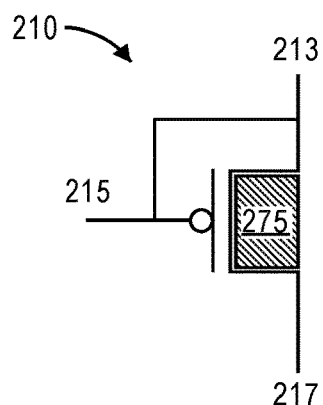
FIGS. 2(a)-2(b) schematically illustrate diagrams of FinFET transistors to be used as an antifuse element having a path through a fin area to couple a source electrode and a drain electrode after a programming operation is performed when the FinFET transistor is in an off-state, in accordance with some embodiments.
Figure 2B:
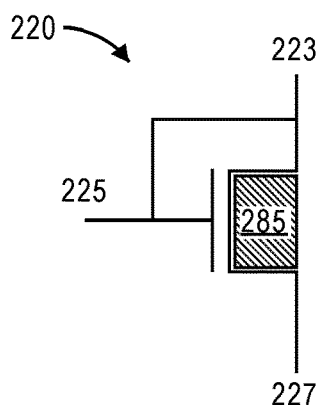

FIGS. 2(a)-2(b) schematically illustrate diagrams of FinFET transistors, e.g., a PMOS FinFET transistor 210, or a NMOS FinFET transistor 220, to be used as an antifuse element having a path through a fin area to couple a source electrode and a drain electrode after a programming operation is performed when the FinFET transistor is in an off-state, in accordance with some embodiments. In embodiments, the PMOS FinFET transistor 210, or the NMOS FinFET transistor 220 may be an example of the FinFET transistor 100 shown in FIG. 1.

In embodiments, the PMOS FinFET transistor 210 may include a gate electrode 215, a source electrode 213, and a drain source electrode 217. The gate electrode 215 may be coupled to the source electrode 213, so that the voltage between the gate electrode 215 and the source electrode 213 may be zero, which may be less than the threshold voltage for the PMOS FinFET transistor 210. Hence, the PMOS FinFET transistor 210 is in an off-state. A programming voltage for the PMOS FinFET transistor 210 may be applied between the source electrode 213 and the drain electrode 217 to generate a current flowing between the source electrode 213 and the drain electrode 217. The programming voltage may be less than 3V, and the current may be less than 100 microamperes (µA). A path 275 may be formed through a fin area, not shown, to couple the source electrode 213 and the drain electrode 217.

In embodiments, the NMOS FinFET transistor 220 may include a gate electrode 225, a source electrode 223, and a drain electrode 227. The gate electrode 225 may be coupled to the source electrode 223, so that the voltage between the gate electrode 225 and the source electrode 223 may be zero, which may be less than the threshold voltage for the NMOS FinFET transistor 220. Hence, the NMOS FinFET transistor 220 may be in an off-state. A programming voltage for the NMOS FinFET transistor 220 may be applied between the source electrode 223 and the drain electrode 227 to generate a current flowing between the source electrode 223 and the drain electrode 227. The programming voltage may be less than 3V, and the current may be less than 100 µA. A path 285 may be formed through a fin area, not shown, to couple the source electrode 223 and the drain electrode 227.

FIGS. 3(a)-3(d) schematically illustrate diagrams of FinFET transistors, a PMOS FinFET transistor 310, or a NMOS FinFET transistor 320, to be used as an antifuse element having a path through a fin area to couple a source electrode and a drain electrode after a programming operation is performed when the FinFET transistor is in an on-state, and its sense and standby operations, in accordance with some embodiments. In embodiments, the PMOS FinFET transistor 310, or the NMOS FinFET transistor 320, may be an example of the FinFET transistor 100 shown in FIG. 1.

Figure 3A:
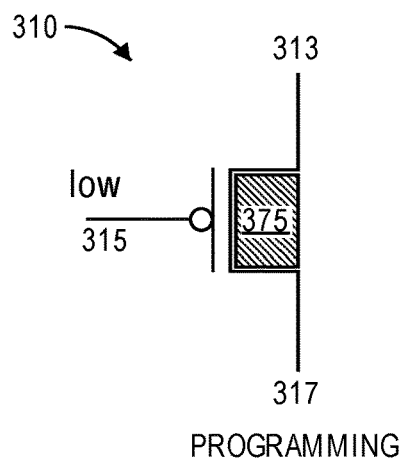
FIGS. 3(a)-3(d) schematically illustrate diagrams of FinFET transistors to be used as an antifuse element having a path through a fin area to couple a source electrode and a drain electrode after a programming operation is performed when the FinFET transistor is in an on-state, and its sense and standby operations, in accordance with some embodiments.

In embodiments, as shown in FIG. 3(a), the PMOS FinFET transistor 310 may include a gate electrode 315, a source electrode 313, and a drain electrode 317. A programming operation may be performed when the gate electrode 315 may be held low to have the PMOS FinFET transistor 310 in an on-state. A voltage between the gate electrode 315 and the source electrode 313 may be larger than a threshold voltage so that the PMOS FinFET transistor 310 is in an on-state. A programming voltage for the PMOS FinFET transistor 310 may be applied between the source electrode 313 and the drain electrode 317 to generate a current flowing between the source electrode 313 and the drain electrode 317. The programming voltage may be less than 2V, and the current may be less than 200 µA. A path 375 may be formed through a fin area, not shown, to couple the source electrode 313 and the drain electrode 317.

Figure 3B:
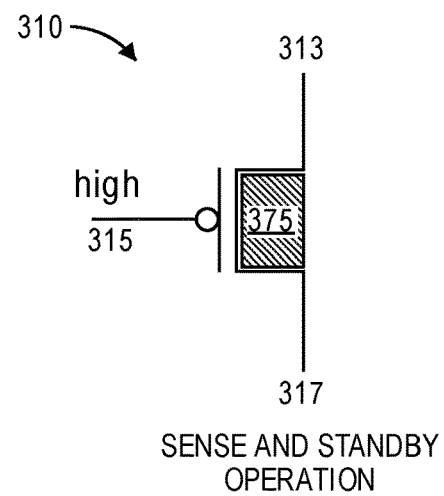

In embodiments, as shown in FIG. 3(b), the gate electrode 315 may be held high to have the PMOS FinFET transistor 310 in an off-state. The resistance between the source electrode 313 and the drain electrode 317 may be sensed to read the digital content represented by the resistance. In addition, the gate electrode 315 may be held high to have the PMOS FinFET transistor 310 in an off-state during a standby operation.

Figure 3C:
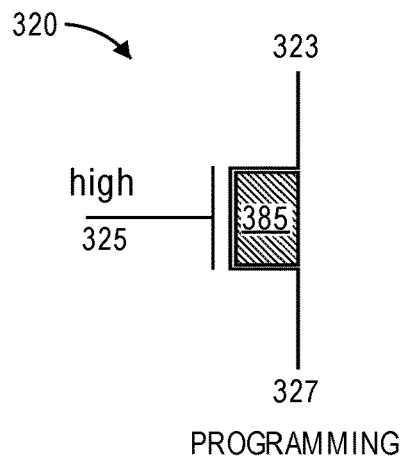

In embodiments, as shown in FIG. 3(c), the NMOS FinFET transistor 320 may include a gate electrode 325, a source electrode 323, and a drain electrode 327. A programming operation may be performed when the gate electrode 325 may be held high to have the NMOS FinFET transistor 320 in an on-state. A voltage between the gate electrode 325 and the source electrode 323 may be larger than a threshold voltage so that the NMOS FinFET transistor 320 is in an on-state. A programming voltage for the NMOS FinFET transistor 320 may be applied between the source electrode 323 and the drain electrode 327 to generate a current flowing between the source electrode 323 and the drain electrode 327. The programming voltage may be less than 2V, and the current may be less than 200 µA. A path 385 may be formed through a fin area, not shown, to couple the source electrode 323 and the drain electrode 327.

Figure 3D:
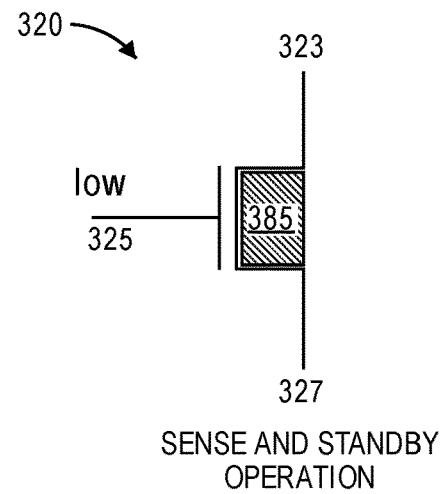

In embodiments, as shown in FIG. 3(d), the gate electrode 325 may be held low to have the NMOS FinFET transistor 320 in an off-state. The resistance between the source electrode 323 and the drain electrode 327 may be sensed to read the digital content represented by the resistance. In addition, the gate electrode 325 may be held low to have the NMOS FinFET transistor 320 in an off-state during a standby operation.

Figure 4:
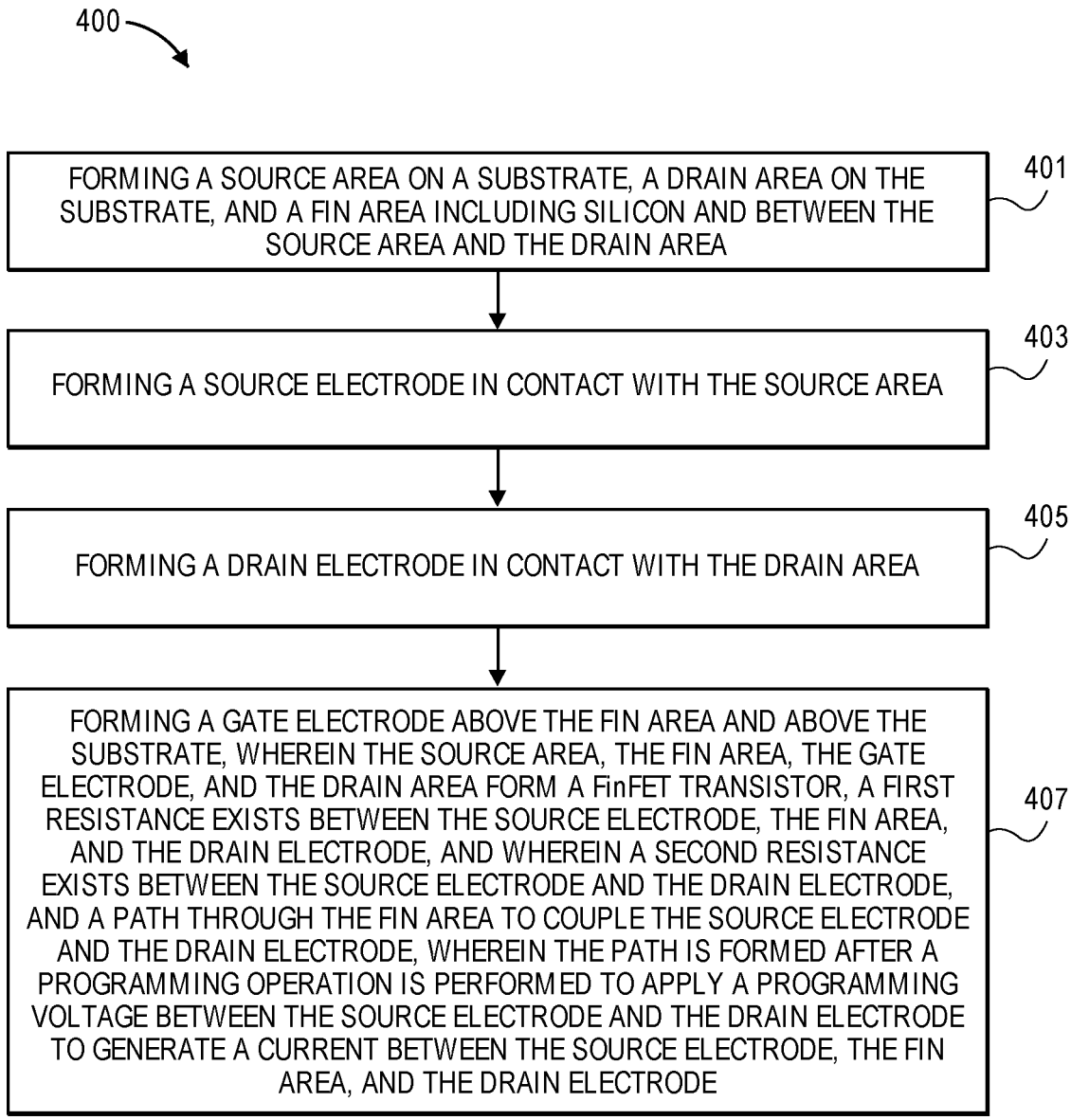
FIG. 4 schematically illustrates a process 400 for forming a FinFET transistor to be used as an antifuse element by having a path through a fin area to couple a source electrode and a drain electrode after a programming operation is performed, in accordance with some embodiments.

FIG. 4 schematically illustrates a process 400 for forming a FinFET transistor to be used as an antifuse element by having a path through a fin area to couple a source electrode and a drain electrode after a programming operation is performed, in accordance with some embodiments. In embodiments, the process 400 may be applied to form the FinFET transistor 100 in FIG. 1, the PMOS FinFET transistor 210, the NMOS FinFET transistor 220, in FIG. 2, the PMOS FinFET transistor 310, or the NMOS FinFET transistor 320 in FIG. 3.

At block 401, the process 400 may include forming a source area on a substrate, a drain area on the substrate, and a fin area including silicon and between the source area and the drain area. For example, the process 400 may include forming the source area 103 on the substrate 101, the drain area 107 on the substrate 101, and the fin area 105 including silicon and between the source area 103 and the drain area 107, as shown in FIG. 1.

At block 403, the process 400 may include forming a source electrode in contact with the source area. For example, the process 400 may include forming the source electrode 113 in contact with the source area 103, as shown in FIG. 1.

At block 405, the process 400 may include forming a drain electrode in contact with the drain area. For example, the process 400 may include forming the drain electrode 117 in contact with the drain area 107, as shown in FIG. 1.

At block 407, the process 400 may include forming a gate electrode above the fin area and above the substrate. The source area, the fin area, the gate electrode, and the drain area form a FinFET transistor. A first resistance may exist between the source electrode, the fin area, and the drain electrode. After a programming operation is performed to apply a programming voltage between the source electrode and the drain electrode to generate a current between the source electrode, the fin area, and the drain electrode, a path may be formed through the fin area to couple the source electrode and the drain electrode. A second resistance may exist between the source electrode and the drain electrode, and the path through the fin area to couple the source electrode and the drain electrode. For example, the process 400 may include forming the gate electrode 115 above the fin area 105 and above the substrate 101. The source area 103, the fin area 105, the gate electrode 115, and the drain area 107 form the FinFET transistor 100. A first resistance 102 may exist between the source electrode 113, the fin area 105, and the drain electrode 117. After a programming operation is performed to apply a programming voltage between the source electrode 113 and the drain electrode 117 to generate a current between the source electrode 113, the fin area 105, and the drain electrode 117, the path 175 may be formed through the fin area 105 to couple the source electrode 113 and the drain electrode 117. A second resistance 104 may exist between the source electrode 113 and the drain electrode 117, and the path 175 through the fin area 105 to couple the source electrode 113 and the drain electrode 117.

In addition, the process 400 may include additional operations to form other layers, e.g., ILD layers, or encapsulation layers, insulation layers, not shown. In some embodiments, the various blocks, e.g., the block 401, the block 403, the block 405, and the block 407, may not be ordered as shown in FIG. 4. Various blocks of the process 400 may be performed in an order different from the one shown in FIG. 4.

Figure 5:
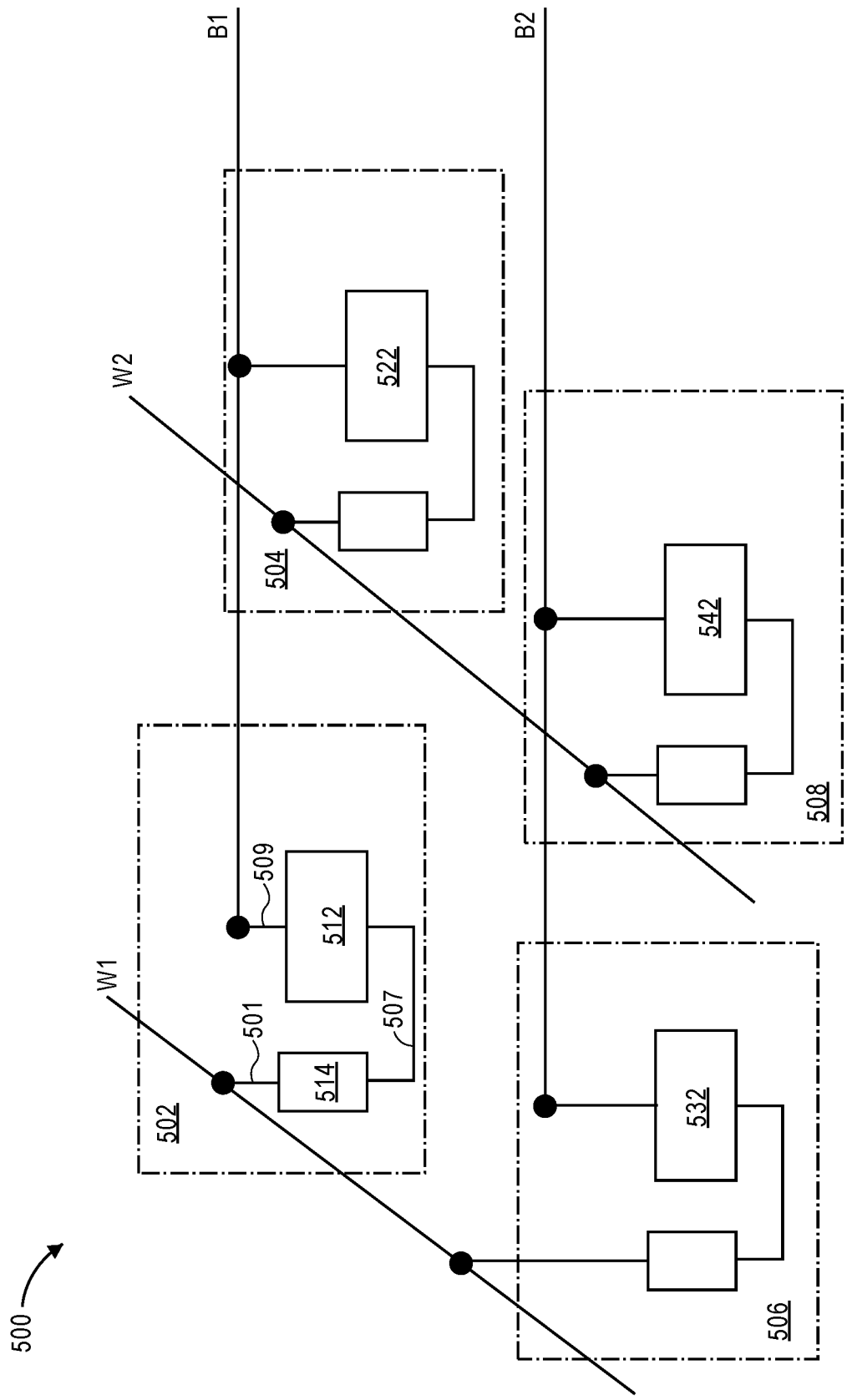
FIG. 5 schematically illustrates an antifuse memory array with multiple antifuse cells, where an antifuse cell includes an antifuse element having a FinFET transistor including a path through a fin area to couple a source electrode and a drain electrode after a programming operation is performed, in accordance with some embodiments.

FIG. 5 schematically illustrates an antifuse memory array 500 with multiple antifuse cells, e.g., an antifuse cell 502, an antifuse cell 504, an antifuse cell 506, and an antifuse cell 508, where an antifuse cell includes an antifuse element having a FinFET transistor including a path through a fin area to couple a source electrode and a drain electrode after a programming operation is performed, in accordance with some embodiments. For example, the antifuse cell 502 includes an antifuse element 512, the antifuse cell 504 includes an antifuse element 522, the antifuse cell 506 includes an antifuse element 532, and the antifuse cell 508 includes an antifuse element 542. In embodiments, the antifuse element 512, the antifuse element 522, the antifuse element 532, and the antifuse element 542 may be similar to the FinFET transistor 100 in FIG. 1, the PMOS FinFET transistor 210, the NMOS FinFET transistor 220 in FIG. 2, or a FinFET transistor to be used as an antifuse element formed following the process 400. In embodiments, the multiple antifuse cells may be arranged in a number of rows and columns coupled by bit lines, e.g., bit line B1 and bit line B2, and word lines, e.g., word line W1 and word line W2.

On the other hand, the PMOS FinFET transistor 310 and the NMOS FinFET transistor 320 may be used in an antifuse memory array different from the antifuse memory array 500 because the PMOS FinFET transistor 310 and the NMOS FinFET transistor 320 may be programed when the PMOS FinFET transistor 310 or the NMOS FinFET transistor 320 is in an on-state, and three signal lines may be used to control the PMOS FinFET transistor 310 or the NMOS FinFET transistor 320.

An antifuse cell, e.g., the antifuse cell 502, may be coupled in series with other antifuse cells, e.g., the antifuse cell 504, of the same row, and may be coupled in parallel with the antifuse cells of other rows, e.g., the antifuse cell 506 and the antifuse cell 508. The antifuse memory array 500 may include any suitable number of one or more antifuse cells. Although the antifuse memory array 500 is shown in FIG. 5 with two rows that each includes two antifuse cells coupled in series, other embodiments may include other numbers of rows and/or numbers of antifuse cells within a row. In some embodiments, the number of rows may be different from the number of columns in an antifuse memory array. Each row of the antifuse memory array may have a same number of antifuse cells. Additionally, or alternatively, different rows may have different numbers of antifuse cells.

In embodiments, multiple antifuse cells, such as the antifuse cell 502, the antifuse cell 504, the antifuse cell 506, and the antifuse cell 508, may have a similar configuration. For example, the antifuse cell 502 may include a selector 514 and the antifuse element 512. The antifuse cell 502 may be controlled through the selector 514 coupled to a bit line and a word line to read from the antifuse cell, write to the antifuse cell, and/or perform other memory operations. For example, the selector 514 may have an electrode 501 coupled to the word line W1, and the antifuse element 512 may have a contact 509 coupled to the bit line B1. In addition, the selector 514 and the antifuse element 512 may be coupled together by the electrode 507. The selector 514 may be a transistor, e.g., a NMOS transistor or a PMOS transistor, or other selection circuit.

In embodiments, the antifuse element 512 may be individually controllable by the selector 514 to switch between a first state and a second state. When the word line W1 is active, the selector 514 may select the antifuse element 512. A signal from the word line W1 may pass through the selector 514, further through the antifuse element 512, and reaching the other electrode, which is the bit line B1.

Figure 6:
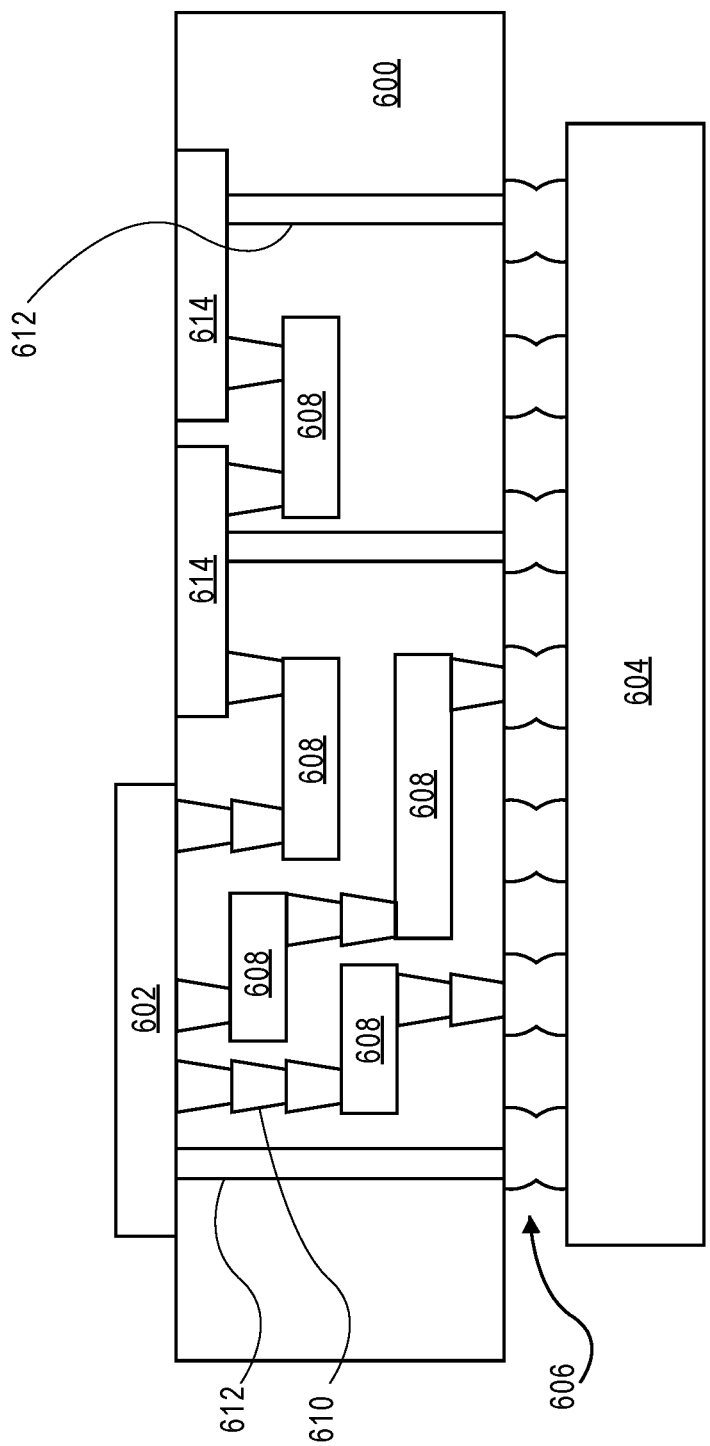
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 may be an intervening substrate used to bridge a first substrate 602 to a second substrate 604. The first substrate 602 may be, for instance, a substrate support for a FinFET transistor to be used as an antifuse element, e.g., the FinFET transistor 100 in FIG. 1, the PMOS FinFET transistor 210, the NMOS FinFET transistor 220, in FIG. 2, the PMOS FinFET transistor 310, the NMOS FinFET transistor 320 in FIG. 3, or a FinFET transistor to be used as an antifuse element formed following the process 400. The second substrate 604 may be, for instance, a memory module, a computer motherboard, or another integrated circuit die. For example, the second substrate 604 may be a memory module including the antifuse memory array 500 as shown in FIG. 5. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. In further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, antifuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
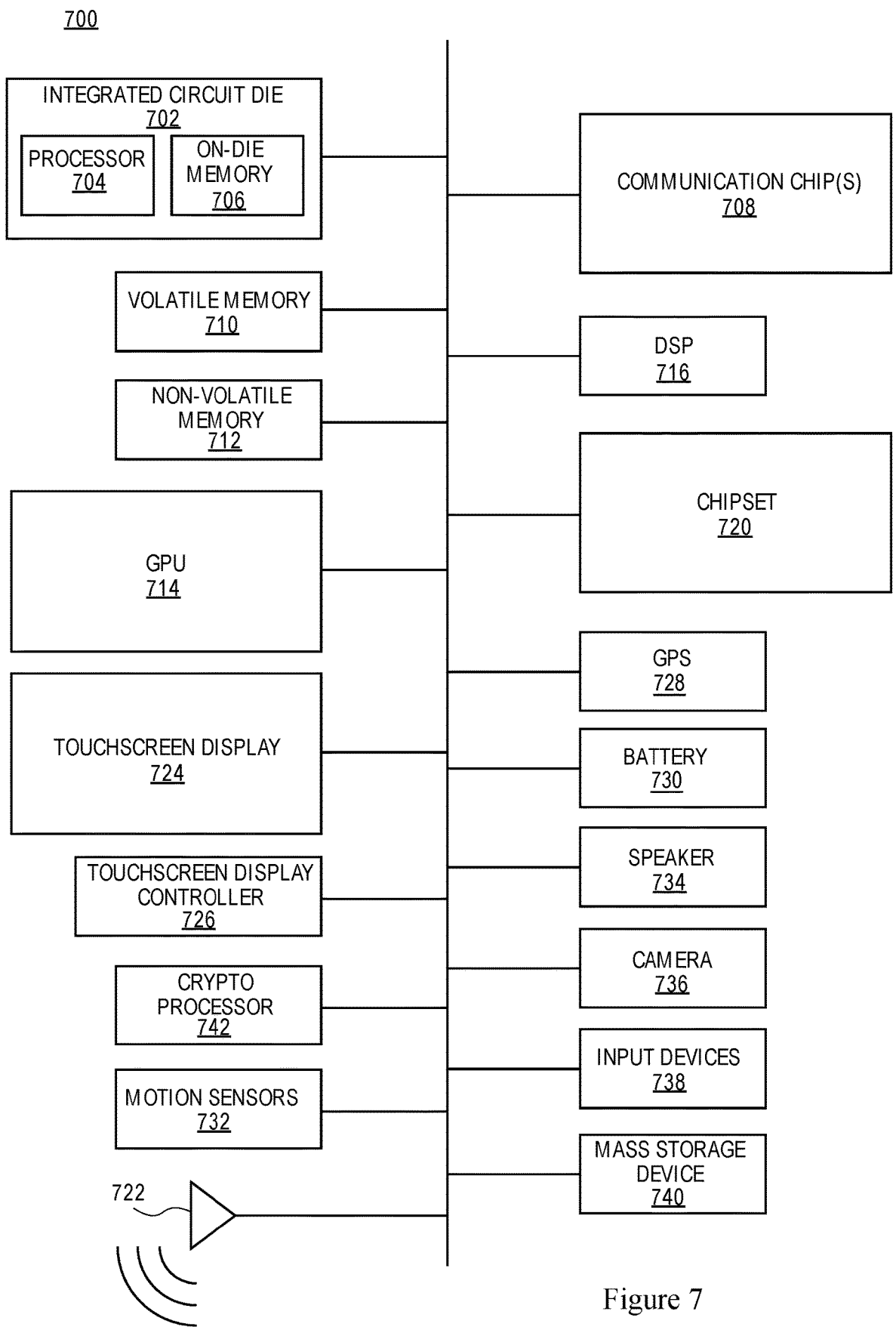
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include a FinFET transistor to be used as an antifuse element, e.g., the FinFET transistor 100 in FIG. 1, the PMOS FinFET transistor 210, the NMOS FinFET transistor 220 in FIG. 2, the PMOS FinFET transistor 310, the NMOS FinFET transistor 320 in FIG. 3, a FinFET transistor to be used as an antifuse element formed following the process 400, or the antifuse memory array 500 shown in FIG. 5.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (μLED) display, or others.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as an antifuse memory array or antifuse elements, which are formed in accordance with implementations of the current disclosure, e.g., the FinFET transistor 100 in FIG. 1, the PMOS FinFET transistor 210, the NMOS FinFET transistor 220 in FIG. 2, the PMOS FinFET transistor 310, the NMOS FinFET transistor 320 in FIG. 3, a FinFET transistor to be used as an antifuse element formed following the process 400, or the antifuse memory array 500 shown in FIG. 5.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include an integrated circuit (IC), comprising: a source electrode in contact with a source area on a substrate; a drain electrode in contact with a drain area on the substrate; a fin area including silicon and between the source area and the drain area; a gate electrode above the fin area and above the substrate; wherein the source area, the fin area, the gate electrode, and the drain area form a FinFET transistor, a first resistance exists between the source electrode, the fin area, and the drain electrode, and wherein a second resistance exists between the source electrode and the drain electrode, and a path through the fin area to couple the source electrode and the drain electrode, wherein the path is formed after a programming operation is performed to apply a programming voltage between the source electrode and the drain electrode to generate a current between the source electrode, the fin area, and the drain electrode.

Example 2 may include the integrated circuit of example 1 and/or some other examples herein, wherein the substrate is a bulk substrate or a silicon-on-insulator (SOI) substrate.

Example 3 may include the integrated circuit of example 1 and/or some other examples herein, wherein the FinFET transistor is a PMOS FinFET or a NMOS FinFET.

Example 4 may include the integrated circuit of example 1 and/or some other examples herein, wherein the programming operation is performed when the FinFET transistor is in an on-state having a voltage between the gate electrode and the source electrode larger than a threshold voltage, or when the FinFET transistor is in an off-state having a voltage between the gate electrode and the source electrode less than the threshold voltage.

Example 5 may include the integrated circuit of example 1 and/or some other examples herein, wherein the programming operation is performed when the FinFET transistor is in an off-state, the programming voltage is less than 3V, and the current is less than 100 microamperes (µA).

Example 6 may include the integrated circuit of example 1 and/or some other examples herein, wherein the programming operation is performed when the FinFET transistor is in an on-state, the programming voltage is less than 2V, and the current is less than 200 µA.

Example 7 may include the integrated circuit of example 1 and/or some other examples herein, wherein the path includes a material migrated from the source electrode or the drain electrode, or amorphous silicon.

Example 8 may include the integrated circuit of example 1 and/or some other examples herein, wherein the first resistance is about 102 to 104 times larger than the second resistance.

Example 9 may include the integrated circuit of example 1 and/or some other examples herein, wherein the source electrode or the drain electrode includes germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

Example 10 may include the integrated circuit of example 1 and/or some other examples herein, wherein the gate electrode is coupled to the source electrode, and the FinFET transistor is in an off-state.

Example 11 may include the integrated circuit of example 1 and/or some other examples herein, wherein the FinFET transistor is a PMOS FinFET transistor, the gate electrode is held low to have the PMOS FinFET transistor in an on-state during the programming operation, and held high to have the PMOS FinFET transistor in an off-state during sense or standby operation.

Example 12 may include the integrated circuit of example 1 and/or some other examples herein, wherein the FinFET transistor is a NMOS FinFET transistor, the gate electrode is held high to have the NMOS FinFET transistor in an on-state during the programming operation, and held low to have the NMOS FinFET transistor in an off-state during sense or standby operation.

Example 13 may include a method for forming an integrated circuit, the method comprising: forming a source area on a substrate, a drain area on the substrate, and a fin area including silicon and between the source area and the drain area; forming a source electrode in contact with the source area; forming a drain electrode in contact with the drain area; forming a gate electrode above the fin area and above the substrate, wherein the source area, the fin area, the gate electrode, and the drain area form a FinFET transistor, a first resistance exists between the source electrode, the fin area, and the drain electrode, and wherein a second resistance exists between the source electrode and the drain electrode, and a path through the fin area to couple the source electrode and the drain electrode, wherein the path is formed after a programming operation is performed to apply a programming voltage between the source electrode and the drain electrode to generate a current between the source electrode, the fin area, and the drain electrode.

Example 14 may include the method of example 13 and/or some other examples herein, wherein the programming operation is performed when the FinFET transistor is in an off-state, the programming voltage is less than 3V, and the current is less than 100 microamperes (µA).

Example 15 may include the method of example 13 and/or some other examples herein, wherein the programming operation is performed when the FinFET transistor is in an on-state, the programming voltage is less than 2V, and the current is less than 200 µA.

Example 16 may include the method of example 13 and/or some other examples herein, wherein the path includes a material migrated from the source electrode or the drain electrode, or amorphous silicon.

Example 17 may include the method of example 13 and/or some other examples herein, wherein the first resistance is about 102 to 104 times larger than the second resistance.

Example 18 may include the method of example 13 and/or some other examples herein, wherein the source electrode or the drain electrode includes germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

Example 19 may include the method of example 13 and/or some other examples herein, wherein the gate electrode is coupled to the source electrode, and the FinFET transistor is in an off-state.

Example 20 may include a computing device, comprising: a circuit board; and an antifuse memory array coupled to the circuit board, wherein the antifuse memory array includes a plurality of antifuse cells, an antifuse cell of the plurality of antifuse cells includes an antifuse element and a selector, and wherein the antifuse element includes: a source electrode in contact with a source area on a substrate, wherein the source electrode is coupled to a bit line of the antifuse memory array; a drain electrode in contact with a drain area on the substrate, wherein the drain electrode is coupled to a first contact of the selector, and the selector includes a second contact coupled to a word line of the antifuse memory array; a fin area including silicon and between the source area and the drain area; and a gate electrode above the fin area and above the substrate; wherein the source area, the fin area, the gate electrode, and the drain area form a FinFET transistor, a first resistance exists between the source electrode, the fin area, and the drain electrode, and wherein a second resistance exists between the source electrode and the drain electrode, and a path through the fin area to couple the source electrode and the drain electrode, wherein the path is formed after a programming operation is performed to apply a programming voltage between the source electrode and the drain electrode to generate a current between the source electrode, the fin area, and the drain electrode.

Example 21 may include the computing device of example 20 and/or some other examples herein, wherein the path includes a material migrated from the source electrode or the drain electrode, or amorphous silicon.

Example 22 may include the computing device of example 20 and/or some other examples herein, wherein the first resistance is about 102 to 104 times larger than the second resistance.

Example 23 may include the computing device of example 20 and/or some other examples herein, wherein the source electrode or the drain electrode includes germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

Example 24 may include the computing device of example 20 and/or some other examples herein, wherein the antifuse element is without a void space when the path is formed after the programming operation is performed to apply the programming voltage between the source electrode and the drain electrode to generate the current between the source electrode, the fin area, and the drain electrode.

Example 25 may include the computing device of example 20 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC), comprising:
   a source electrode in contact with a source area on a substrate, wherein the substrate is a bulk substrate or a silicon-on-insulator (SOI) substrate;
   a drain electrode in contact with a drain area on the substrate;
   a fin area including silicon and between the source area and the drain area;
   a gate electrode above the fin area and above the substrate;
   wherein the source area, the fin area, the gate electrode, and the drain area form a FinFET transistor, a first resistance exists between the source electrode, the fin area, and the drain electrode, and wherein a second resistance exists between the source electrode and the drain electrode via a path through the fin area that couples the source electrode and the drain electrode, wherein the path is formed after a programming operation is performed to apply a programming voltage between the source electrode and the drain electrode to generate a current between the source electrode, the fin area, and the drain electrode, wherein the first resistance is an initial resistance and the second resistance is a subsequent permanent resistance, and wherein the first resistance is greater than the second resistance.

2. The integrated circuit of claim 1, wherein the FinFET transistor is a PMOS FinFET or a NMOS FinFET.

3. The integrated circuit of claim 1, wherein the programming operation is performed when the FinFET transistor is in an on-state having a voltage between the gate electrode and the source electrode larger than a threshold voltage, or when the FinFET transistor is in an off-state having a voltage between the gate electrode and the source electrode less than the threshold voltage.

4. The integrated circuit of claim 1, wherein the path includes a material migrated from the source electrode or the drain electrode, or amorphous silicon.

5. The integrated circuit of claim 1, wherein the first resistance is about $10^2$ to $10^4$ times larger than the second resistance.

6. The integrated circuit of claim 1, wherein the source electrode or the drain electrode includes germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

7. The integrated circuit of claim 1, wherein the gate electrode is coupled to the source electrode, and the FinFET transistor is in an off-state.

8. The integrated circuit of claim 1, wherein the FinFET transistor is a PMOS FinFET transistor, the gate electrode is held low to have the PMOS FinFET transistor in an on-state during the programming operation, and held high to have the PMOS FinFET transistor in an off-state during sense or standby operation.

9. The integrated circuit of claim 1, wherein the FinFET transistor is a NMOS FinFET transistor, the gate electrode is held high to have the NMOS FinFET transistor in an on-state during the programming operation, and held low to have the NMOS FinFET transistor in an off-state during sense or standby operation.

10. A method for forming an integrated circuit, the method comprising:
    forming a source area on a substrate, a drain area on the substrate, and a fin area including silicon and between the source area and the drain area, wherein the substrate is a bulk substrate or a silicon-on-insulator (SOI) substrate;
    forming a source electrode in contact with the source area;
    forming a drain electrode in contact with the drain area;
    forming a gate electrode above the fin area and above the substrate, wherein the source area, the fin area, the gate electrode, and the drain area form a FinFET transistor, a first resistance exists between the source electrode, the fin area, and the drain electrode, and wherein a second resistance exists between the source electrode and the drain electrode via a path through the fin area that couples the source electrode and the drain electrode, wherein the path is formed after a programming operation is performed to apply a programming voltage between the source electrode and the drain electrode to generate a current between the source electrode, the fin area, and the drain electrode, wherein the first resistance is an initial resistance and the second resistance is a subsequent permanent resistance, and wherein the first resistance is greater than the second resistance.

11. The method of claim 10, wherein the path includes a material migrated from the source electrode or the drain electrode, or amorphous silicon.

12. The method of claim 10, wherein the first resistance is about $10^2$ to $10^4$ times larger than the second resistance.

13. The method of claim 10, wherein the source electrode or the drain electrode includes germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

14. The method of claim 10, wherein the gate electrode is coupled to the source electrode, and the FinFET transistor is in an off-state.

15. A computing device, comprising:
    a circuit board; and
    an antifuse memory array coupled to the circuit board, wherein the antifuse memory array includes a plurality of antifuse cells, an antifuse cell of the plurality of antifuse cells includes an antifuse element and a selector, and wherein the antifuse element includes:

a source electrode in contact with a source area on a substrate, wherein the source electrode is coupled to a bit line of the antifuse memory array;

a drain electrode in contact with a drain area on the substrate, wherein the drain electrode is coupled to a first contact of the selector, and the selector includes a second contact coupled to a word line of the antifuse memory array;

a fin area including silicon and between the source area and the drain area; and a gate electrode above the fin area and above the substrate;

wherein the source area, the fin area, the gate electrode, and the drain area form a FinFET transistor, a first resistance exists between the source electrode, the fin area, and the drain electrode, and wherein a second resistance exists between the source electrode and the drain electrode via a path through the fin area that couples the source electrode and the drain electrode, wherein the path is formed after a programming operation is performed to apply a programming voltage between the source electrode and the drain electrode to generate a current between the source electrode, the fin area, and the drain electrode, wherein the first resistance is an initial resistance and the second resistance is a subsequent permanent resistance, and wherein the first resistance is greater than the second resistance.

16. The computing device of claim 15, wherein the path includes a material migrated from the source electrode or the drain electrode, or amorphous silicon.

17. The computing device of claim 15, wherein the first resistance is about $10^2$ to $10^4$ times larger than the second resistance.

18. The computing device of claim 15, wherein the source electrode or the drain electrode includes germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

19. The computing device of claim 15, wherein the antifuse element is without a void space when the path is formed after the programming operation is performed to apply the programming voltage between the source electrode and the drain electrode to generate the current between the source electrode, the fin area, and the drain electrode.

20. The computing device of claim 15, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera.

* * * * *